US012644183B2

(12) United States Patent
    Subramani et al.

(10) Patent No.: US 12,644,183 B2
(45) Date of Patent: Jun. 2, 2026

(54) SHOWERHEAD ASSEMBLY WITH HEATED SHOWERHEAD

(71) Applicant: Applied Materials, Inc., Santa Clara, CA (US)

(72) Inventors: Anantha K. Subramani, San Jose, CA (US); Seyyed Abdolreza Fazeli, Santa Clara, CA (US); Yang Guo, San Mateo, CA (US); Chandrashekara Baginagere, Bangalore (IN); Ramcharan Sundar, Bangalore (IN); Steven Mosbrucker, Sunnyvale, CA (US); John Lee, Sunnyvale, CA (US); Yiyang Wan, Sunnyvale, CA (US); Shumao Zhang, San Jose, CA (US); Dhritiman Subha Kashyap, Bangalore (IN); Azhar Ali M.A, Bangalore (IN)

(73) Assignee: Applied Materials Inc., Santa Clara, CA (US)

( * ) Notice: Subject to any disclaimer, the term of this patent is extended or adjusted under 35 U.S.C. 154(b) by 412 days.

(21) Appl. No.: 18/199,223

(22) Filed: May 18, 2023

(65) Prior Publication Data

US 2024/0068096 A1 Feb. 29, 2024

Related U.S. Application Data

(60) Provisional application No. 63/402,366, filed on Aug. 30, 2022.

(51) Int. Cl.
    *C23C 16/455* (2006.01)
    *C23C 16/44* (2006.01)
    (Continued)

(52) U.S. Cl.
    CPC ...... *C23C 16/4557* (2013.01); *C23C 16/4408* (2013.01); *C23C 16/452* (2013.01); *C23C 16/45565* (2013.01); *C23C 16/505* (2013.01)

(58) Field of Classification Search
    CPC ........... C23C 16/4557; C23C 16/4408; C23C 16/452; C23C 16/45565; C23C 16/505; C23C 16/4583
    See application file for complete search history.

(56) References Cited

U.S. PATENT DOCUMENTS 6,123,775 A 9/2000 Hao et al.
6,827,815 B2 12/2004 Hytros et al.
(Continued)

FOREIGN PATENT DOCUMENTS

CN 204134770 U 2/2015
JP H08148472 A 6/1996
(Continued)

OTHER PUBLICATIONS

PCT International Search Report and Written Opinion for PCT/US2022/036314 dated Jan. 10, 2023.
(Continued)

*Primary Examiner* — Jeffrie R Lund
(74) *Attorney, Agent, or Firm* — Moser Taboada

(57) ABSTRACT

In some embodiments, a showerhead assembly includes a heated showerhead having a heater plate and a gas distribution plate coupled together; an ion filter spaced from the heated showerhead; a spacer ring in contact between the heated showerhead and the ion filter; a remote plasma region between the heated showerhead and the ion filter; an upper isolator spaced from the spacer ring and supported on the ion filter; a sealing ring fastened to the heated showerhead sealing against the upper isolator and pushing the upper isolator against the ion filter; a gap between a bottom of the (Continued)

gas distribution plate and a top of the ion filter, the gap being in fluid communication with the remote plasma region; a first passage extending through the heater plate; and a second passage in communication with the first passage and extending through the gas distribution plate, the second passage extending to the gap.

17 Claims, 10 Drawing Sheets

(51) Int. Cl.
*C23C 16/452* (2006.01)
*C23C 16/505* (2006.01)

(56) References Cited

U.S. PATENT DOCUMENTS

| | | | |
|---|---|---|---|
| 6,830,007 | B2 | 12/2004 | Matsuki et al. |
| 7,722,925 | B2 | 5/2010 | White et al. |
| 11,069,514 | B2 | 7/2021 | Shah et al. |
| 2002/0129769 | A1 | 9/2002 | Kim et al. |
| 2003/0154921 | A1 | 8/2003 | Matsuki et al. |
| 2009/0151639 | A1 | 6/2009 | Kasai et al. |
| 2011/0030615 | A1 | 2/2011 | Griffin et al. |
| 2011/0256692 | A1 * | 10/2011 | Tam .......................... B05B 1/18 |
| | | | 118/724 |
| 2012/0031559 | A1 | 2/2012 | Dhindsa et al. |
| 2012/0097330 | A1 | 4/2012 | Iyengar et al. |
| 2012/0114856 | A1 | 5/2012 | Park et al. |
| 2012/0322011 | A1 | 12/2012 | Wu et al. |
| 2015/0371825 | A1 | 12/2015 | Kobayashi et al. |
| 2017/0211185 | A1 | 7/2017 | Du Bois et al. |
| 2019/0078210 | A1 | 3/2019 | Gungor et al. |
| 2020/0098549 | A1 | 3/2020 | Park et al. |
| 2023/0335377 | A1 * | 10/2023 | Subramani .......... C23C 16/4557 |
| 2024/0068096 | A1 * | 2/2024 | Subramani ............ C23C 16/452 |
| 2025/0037976 | A1 * | 1/2025 | Alewoor ........... H01J 37/32458 |
| 2025/0320605 | A1 * | 10/2025 | Patel ................. C23C 16/45565 |

FOREIGN PATENT DOCUMENTS

| | | | |
|---|---|---|---|
| KR | 10-2099886 B1 | 4/2020 | |
| TW | 202533403 A * | 8/2025 | |
| WO | WO-2022005864 A1 * | 1/2022 | ......... C23C 16/4404 |

OTHER PUBLICATIONS

International Search Report for PCT/US2023/029804, dated Nov. 29, 2023.

* cited by examiner

_—400_

APPLY POWER TO HEATING ELEMENT TO
RAISE TEMPERATURE OF ION FILTER
> 575 DEGREES CELSIUS     —402

INTRODUCE TiCl4 INTO FIRST PLENUM     —404

GENERATE PLASMA IN SECOND PLENUM
AND PROCESSING VOLUME     —406

DEPOSIT TiCl3 RADICALS ONTO SUBSTRATE     —408

| | |
|---|---|
| ⟶ | PURGE PATH |
| ⤏ | POTENTIAL PURGE LOSS PATH |
| ⟹ | TIClx FLOW PATH |

SHOWERHEAD ASSEMBLY WITH HEATED SHOWERHEAD

CROSS-REFERENCE TO RELATED APPLICATIONS

This application claims benefit of U.S. provisional patent application Ser. No. 63/402,366, filed Aug. 30, 2022, which is herein incorporated by reference in its entirety.

FIELD

Embodiments of the present disclosure generally relate to semiconductor processing equipment, and, more particularly, to showerhead assemblies used in semiconductor processing equipment.

BACKGROUND

Substrate processing equipment generally includes process chambers configured to perform certain processes on a substrate, for example, chemical vapor deposition (CVD), atomic layer deposition (ALD), etching, or the like. Some process chambers may use showerheads to dispense process gases over substrates when performing certain processes, such as plasma processing. However, the inventors have observed that, for example in metal plasma enhanced chemical vapor deposition (PECVD) applications, a difficulty can arise in separating electrically hot and grounded components in an environment with gaseous metal compounds.

Accordingly, the inventors have provided embodiments of improved showerheads as disclosed herein.

SUMMARY

Methods and apparatus for substrate processing are provided herein. In some embodiments, a showerhead assembly for use in a process chamber includes a heated showerhead having a heater plate and a gas distribution plate coupled to the heater plate; an ion filter spaced from the heated showerhead; a spacer ring in contact between the heated showerhead and the ion filter; a remote plasma region defined between the heated showerhead and the ion filter; an upper isolator spaced from the spacer ring and supported on a portion of the ion filter radially outward of the spacer ring; a sealing ring fastened to the heated showerhead sealing against the upper isolator and pushing the upper isolator against the ion filter; a gap, on a radially inner side of the spacer ring, between a bottom of the gas distribution plate and a top of the ion filter, the gap being in fluid communication with the remote plasma region; a first passage extending through the heater plate; and a second passage in communication with the first passage and extending through the gas distribution plate, the second passage extending to the gap.

In some embodiments, a showerhead assembly for use in a process chamber includes a heated showerhead having a heater plate and a gas distribution plate coupled to the heater plate; an ion filter spaced from the heated showerhead; a spacer ring in contact between the heated showerhead and the ion filter, the spacer ring being thermally conductive and electrically insulative, the spacer ring comprised of a plurality of elements spaced from one another along an interface between the heated showerhead and the ion filter; a remote plasma region defined between the heated showerhead and the ion filter; an upper isolator spaced from the spacer ring and supported on a portion of the ion filter radially outward of the spacer ring; a sealing ring attached to the heated showerhead sealing against the upper isolator and pushing the upper isolator against the ion filter; a gap, on a radially inner side of the spacer ring, between a bottom of the heated showerhead and a top of the ion filter, the gap being in fluid communication with the remote plasma region; a first passage extending through the heater plate; a second passage in communication with the first passage and extending through the gas distribution plate, the second passage extending to the gap; and a volume defined by the heated showerhead, the ion filter, the sealing ring, the upper isolator, and the spacer ring, wherein the volume is in fluid communication with the gap.

In some embodiments, a process chamber includes a chamber body having an interior volume; a substrate support disposed in the interior volume; a showerhead assembly disposed in the interior volume opposite the substrate support, wherein the showerhead assembly comprises: a heated showerhead having a heater plate and a gas distribution plate coupled to the heater plate; an ion filter spaced from the heated showerhead; a spacer ring in contact between the heated showerhead and the ion filter; a remote plasma region defined between the heated showerhead and the ion filter; an upper isolator spaced from the spacer ring and supported on a portion of the ion filter radially outward of the spacer ring; a sealing ring fastened to the heated showerhead sealing against the upper isolator and pushing the upper isolator against the ion filter; a first gap, on a radially inner side of the spacer ring, between a bottom of the gas distribution plate and a top of the ion filter, the first gap being in fluid communication with the remote plasma region; a first passage extending through the heater plate; and a second passage in communication with the first passage and extending through the gas distribution plate, the second passage extending to the first gap.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
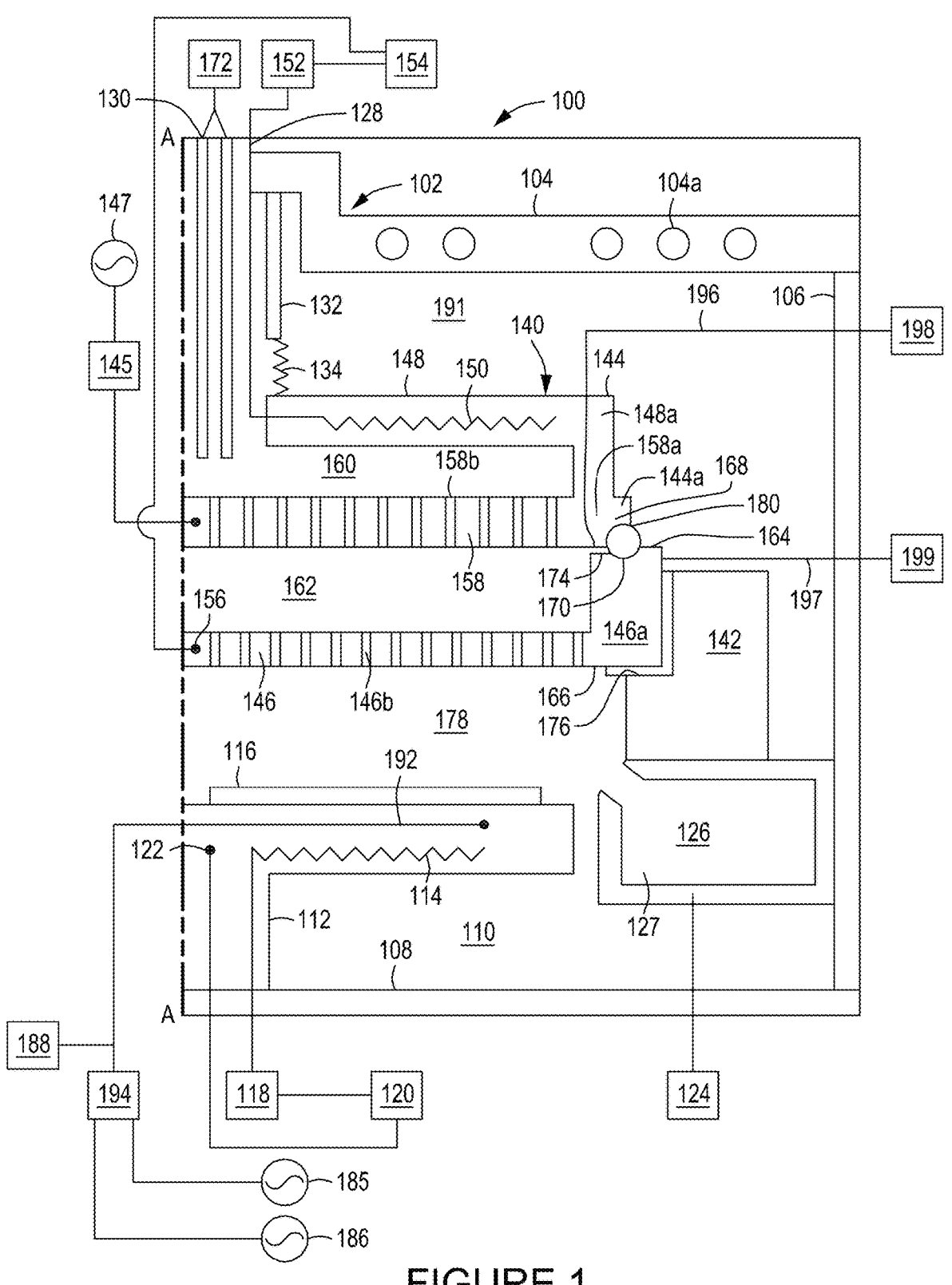
FIG. 1 is a partial schematic section view of a processing chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for processing substrates in a PECVD chamber are provided herein. In some embodiments, radio frequency (RF) plasma can be formed between showerhead and an ion filter which are separated by aluminum nitride (AlN) spacers on the periphery. Metal vapor is kept from reaching the insulators by a strong argon purge. The argon purge is contained within the remote cavity by a ring that is fastened to the showerhead while pressing against an outer ceramic ring to form a seal.

Embodiments of apparatus and methods for providing plasma to a process chamber that may reduce or eliminate condensation or deposition in areas of a showerhead assembly of material from plasma are described herein.

The inventors have observed that some showerheads in plasma processing chambers operate at temperatures that allow material to condense or deposit from plasma in undesired areas of the process chamber, such as in portions of a showerhead assembly. The accumulation of material can undesirably lead to arcing issues between electrically hot and grounded portions of the showerhead assembly. In accordance with one aspect, embodiments of showerhead assemblies are described that advantageously reduce or eliminate undesired deposition in areas of the showerhead assembly that could lead to arcing.

FIG. 1 is a partial cross-sectional view of a processing chamber 100 suitable for depositing material (e.g., TiCl₃) on a substrate. The processing chamber 100 may be any process chamber suitable for plasma enhanced semiconductor processing, for example, such as a process chamber configured to perform a plasma assisted chemical vapor deposition (CVD) or an atomic layer deposition (ALD) process. Exemplary process chambers may include process chambers available from Applied Materials, Inc. of Santa Clara, California. Other processing systems, including those produced by other manufacturers, may benefit from embodiments described herein.

Accordingly, in some embodiments, and as shown in FIG. 1, the processing chamber 100 includes a chamber body 102 having a lid 104, a side wall 106, and a bottom wall 108 that define an interior volume 110. A pedestal 112 (e.g., a substrate support) is provided in the interior volume 110 of the processing chamber 100. The pedestal 112 may be fabricated from aluminum, ceramic, and other suitable materials. In some embodiments, the pedestal 112 is fabricated from a ceramic material, such as aluminum nitride, which is a material suitable for use in a high temperature environment, such as a plasma process environment, without causing thermal damage to the pedestal 112. The pedestal 112 may be moved in a vertical direction along axis A-A in the interior volume 110 using a lift mechanism (not shown).

The pedestal 112 may include an embedded heater element 114 suitable for controlling the temperature of a substrate 116 supported on the pedestal 112. In some embodiments, the pedestal 112 may be resistively heated by applying an electric current from a power supply 118 to the heater element 114. In some embodiments, the heater element 114 may be made of a nickel-chromium wire encapsulated in a nickel-iron-chromium alloy (e.g., INCOLOY®) sheath tube. The electric current supplied from the power supply 118 is regulated by a controller 120 to control the heat generated by the heater element 114, thereby maintaining the substrate 116 and the pedestal 112 at a substantially constant temperature during film deposition at any suitable temperature range.

A temperature sensor 122, such as a thermocouple, may be embedded in the pedestal 112 to monitor the temperature of the pedestal 112 in a conventional manner. The measured temperature is used by the controller 120 to control the power supplied to the heater element 114 to maintain the substrate at a desired temperature.

The pedestal 112 generally includes a plurality of lift pins (not shown) disposed therethrough that are configured to lift the substrate 116 from the pedestal 112 and facilitate exchange of the substrate 116 with a robot (not shown) in a conventional manner.

A vacuum pump 124 is coupled to a port formed in the bottom wall 108 of the chamber body 102 and to a pumping ring 126 that surrounds the pedestal 112. The pumping ring 126 has a fluid passageway 127 in fluid communication with a processing volume 178. The vacuum pump 124 is used to maintain a desired gas pressure in the processing chamber 100. The vacuum pump 124 also evacuates post-processing gases and by-products of the process from the processing chamber 100 through the pumping ring 126.

In some embodiments, and as shown in FIG. 1, the lid 104 includes a plurality of fluid channels 104a extending within the lid. The fluid channels 104a are fluidly coupled to a supply of heat transfer fluid (e.g., water). The fluid channels 104a configured to flow the heat transfer fluid to control the temperature of the lid 104 and the interior volume 110. The lid 104 also includes an opening 128 through which a plurality of gas conduits 130 extend. In some embodiments, the lid 104 may be formed from aluminum. In some embodiments, and as shown in FIG. 1, the gas conduits 130 are at least partially surrounded by an outer tube 132 extending down from the lid 104 and a bellows 134 that extend down from the outer tube 132. In some embodiments, the bellows 134 may be welded to the heater plate 148 to prevent any leakage of the precursor into a purge volume 191 outside of the bellows 134 and the outer tube 132.

The bellows 134 supports a showerhead assembly 140 disposed in the interior volume 110 opposite the pedestal 112. In embodiments, the bellows 134 permits some movement of the showerhead assembly 140 in an axial direction along axis A-A. Also, the showerhead assembly 140 is supported by a lower isolator 142, which is supported by the pumping ring 126, which may be fixed in position to the chamber body 102. For example, the pumping ring may be fixed to at least one of the side wall 106 or the bottom wall 108. The lower isolator 142 may be at least partly disposed between the ion filter 146 and the pumping ring 126. The lower isolator 142 may support the ion filter spaced above the pedestal 112. The lower isolator 142 may comprise any process compatible electrically insulating material. For example, in some embodiments, the electrical insulator ring may be fabricated from quartz ($SiO_2$), a sintered ceramic such as aluminum oxide ($Al_2O_3$) or silicon nitride (SiN), or a single crystal sapphire ($Al_2O_3$).

The showerhead assembly 140 includes a heated showerhead 144, an ion filter 146, and a spacer ring 180 in contact between the heated showerhead 144 and the ion filter 146. The heated showerhead 144 includes a heater plate having a central opening through which the gas conduits 130 extend. The heater plate 148 is connected along an upper side to the bellows 134. In embodiments, the heater plate 148 may include an embedded heater element 150 suitable for controlling the temperature of the showerhead assembly 140. In some embodiments, the heater plate 148 may be resistively heated by applying an electric current from a power supply 152 to the heater element 150. In some embodiments, the heater element 150 may be made of a nickel-chromium wire encapsulated in a nickel-iron-chromium alloy (e.g., INCOLOY®) sheath tube. The electric current supplied from the power supply 152 is regulated by a controller 154 to control the heat generated by the heater element 150, thereby maintaining the ion filter 146 at a substantially constant temperature during film deposition at any suitable temperature range. The supplied electric current may be adjusted to selectively control the temperature of the ion filter above 575 degrees Celsius.

A temperature sensor 156, such as a thermocouple, may be embedded in the ion filter 146 to monitor the temperature of the ion filter 146. Since the ion filter 146 is located in a region of the showerhead assembly 140 where plasma will be present and condensation may occur, the temperature of the ion filter 146 is used to control the heater element 150. Thus, in some embodiments, and as shown in FIG. 1, the measured temperature of the ion filter 146 is used by the controller 154 to control the power supplied to the heater element 150 to maintain the ion filter 146 at a desired temperature above a condensation temperature of species in plasma.

The heated showerhead 144 also includes a gas distribution plate 158 extending parallel to the heater plate 148. In some embodiments, and as shown in FIG. 1, the gas distribution plate 158 and the heater plate 148 are connected at their respective outer edges 158a and 148a and define a first plenum 160. The gas distribution plate 158 includes a plurality of through holes 158b, which permit the flow of gas from the gas conduits 130 through the gas distribution plate 158. In some embodiments, the heater plate 148 and the gas distribution plate 158 may be formed from nickel.

The ion filter 146 extends parallel to, and is axially spaced from, the gas distribution plate 158. A second plenum 162 (e.g., remote cavity) is defined between the ion filter 146 and the gas distribution plate 158. In some embodiments, and as shown in FIG. 1, the ion filter 146 has a flange 146a with an upper side 164 that faces a flange 144a of the heated showerhead 144. Also, the flange 146a of the ion filter 146 has a lower side 166 that faces the lower isolator 142. The flanges 144a and 146a include respective grooves 168, 170 defining an interface between the heated showerhead 144 and the ion filter 146. The grooves 168, 170 may extend along a circular interface centered about axis A-A. In some embodiments, and as shown in FIG. 1, the grooves 168, 170 may have a cross sectional profile that is arcuate, although other shapes may be used. The ion filter 146 includes a plurality of through holes 146b that permit the flow of gas through the ion filter 146. In some embodiments, the ion filter 146 may be formed from nickel.

In some embodiments, the through holes 158b in the gas distribution plate 158 and the through holes 146b in the ion filter 146 may be utilized to introduce gases from a gas panel 172 into the processing chamber 100 through the gas conduits 130 and the showerhead assembly 140. The through holes 158b, 146b may have different sizes, number, and distributions, shape, design, and diameters to facilitate the flow of the various process gases for different processing purposes. For example, in some embodiments, a plasma may be formed from a process gas mixture exiting the showerhead assembly 140 to enhance thermal decomposition of the process gases in the process gas mixture resulting in the deposition of material on the surfaces of the substrate.

Figure 2:
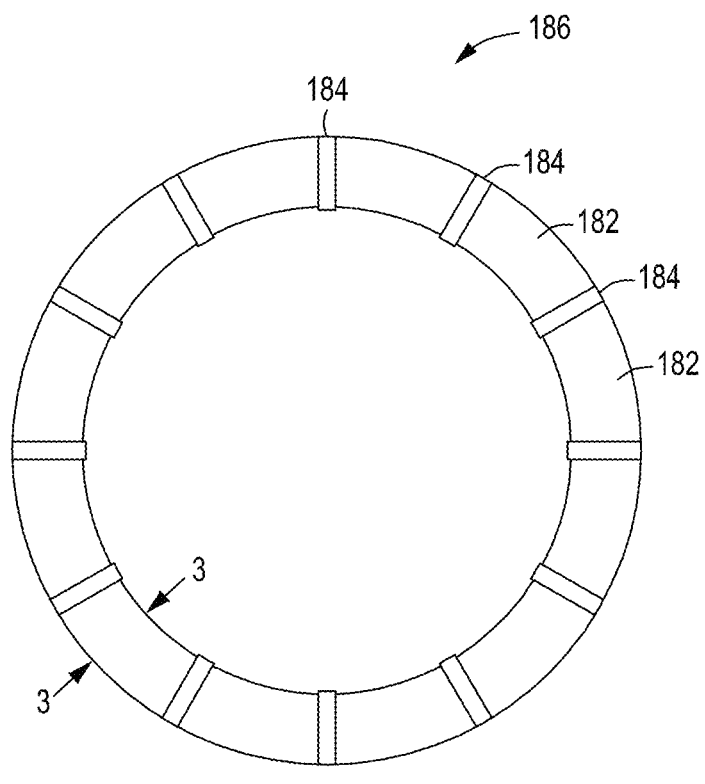
FIG. 2 is a plan view of a heat transfer ring in accordance with at least some embodiments of the present disclosure.

The spacer ring 180 is seated in the grooves 168 and 170 at the interface between the flanges 144a and 146a. The spacer ring 180 is thermally conductive and electrically insulative. In some embodiments, the spacer ring 180 is formed from aluminum nitride. As shown in greater detail in FIG. 2, and in some embodiments, the spacer ring 180 includes a plurality of elements 182 that are configured to be arranged along the interface. In the example embodiment shown in FIG. 2, the elements 182 are formed as arcuate segments and are arranged along a circle. The elements 182 are spaced (e.g., circumferentially) from one another by gaps 184 that are of a sufficient size to permit the elements 182 to expand based on the coefficient of thermal expansion of the material of the elements 182 and fill the gaps without cracking or otherwise damaging the elements 182 when the elements 182 are at or above a predetermined temperature. In one example, at room temperature, the gap 184 between the elements is about 5 mm to 7 mm to allow the elements to expand when the process temperature is 575 degrees Celsius to 600 degrees Celsius. Also, since the gaps 184 between the elements 182 may create leak paths if not closed or restricted, operationally the temperature of the spacer ring 180 may be raised to cause the elements 182 to expand to reduce the size of the gaps 184 prior to introducing gas into the showerhead assembly 140 through gas conduits 130.

Figure 3:
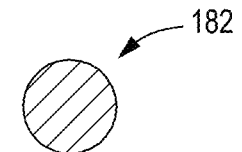
FIG. 3 is a section view through the heat transfer ring of FIG. 2 along line 3-3.

In some embodiments, and as shown in FIG. 3, the cross-section of the elements 182 may be circular cross-section or a tubular cross-section. In some embodiments, the spacer ring 180 includes at least fifteen elements. In some embodiments, the heat transfer ring includes eighteen to thirty-six elements.

As shown in FIG. 1, when the spacer ring 180 is seated in the grooves 168, 170, the flanges 144a and 146a remain spaced from one another by a gap 174 on a radially inner side of the spacer ring 180. Thus, in some embodiments, the heated showerhead 144 and the ion filter 146 are not in direct contact with one another, but only indirectly connected by the spacer ring 180. In some embodiments, the gap 174 is about 5 mm to 7 mm. The gap 174 provides a plasma confinement feature for remote plasma in the second plenum 162 (e.g., remote plasma region). The gap 174 is in fluid communication with the second plenum 162. In embodiments, the gap 174 is in fluid communication with a purge channel 196 and supply of purge gas 198. In embodiments, prior to introduction of process gases into the showerhead assembly 140 through gas conduits 130, purge gas may be introduced into the second plenum 162 through the purge channel 196 and the gap 174. In some embodiments, and as shown in FIG. 1, the purge channel 196 may be connected (e.g., welded) to the heater plate 148. In some embodiments, the purge channel may be attached to the bellows 134.

In some embodiments, and as shown in FIG. 1, the flange 146a of the ion filter 146 may be spaced from the lower isolator 142 by a gap 176. The gap 176 may be about 5 mm to 7 mm. The gap 176 may aid in direct plasma confinement between the ion filter 146 and the substrate 116. The gap 176 is in fluid communication with a processing volume 178 between the ion filter 146 and the substrate 116. In some embodiments, the gap 176 is in fluid communication with a purge channel 197 and a supply of purge gas 199. In some embodiments, prior to introduction of process gases from the gas conduits 130 into the showerhead assembly 140, the purge gas may flow into the processing volume 178 from the purge channel 197 and the gap 176. The pumping ring 126 is also in fluid communication with the processing volume 178. Purge gas in the processing volume 178 can be exhausted from processing volume 178 through the pumping ring 126.

The heated showerhead 144, the ion filter 146, and the pedestal 112 may be configured as electrodes. In one example, the pedestal 112 comprises at least one electrode 192 for retaining the substrate 116 on the pedestal 112. The electrode 192 is driven by a chucking power source 188 to develop an electrostatic force that holds the substrate 116 to the pedestal surface, as is conventionally known. Alternatively, the substrate 116 may be retained to the pedestal 112 by clamping, vacuum, or gravity.

In some embodiments, the pedestal 112 is configured as a cathode having the electrode 192 embedded therein coupled to RF bias power sources 185, 186. Although the example embodiment depicted in FIG. 1 shows two RF bias power sources, 185, 186, the numbers of the RF bias power sources may be any number as needed. The RF bias power sources 185, 186 are coupled between the electrode 192 disposed in the pedestal 112 and another electrode, such as the heated showerhead 144, the ion filter 146, or lid 104 of the processing chamber 100. One or both of the RF bias power sources 185, 186 excite and sustain a plasma discharge formed from the gases disposed in the processing volume 178 of the processing chamber 100.

In the embodiment depicted in FIG. 1, the dual RF bias power sources 185, 186 are coupled to the electrode 192 disposed in the pedestal 112 through a matching circuit 194. The signal generated by the RF bias power sources 185, 186 is delivered through matching circuit 194 to the pedestal 112 through a single feed to ionize the gas mixture provided in the processing chamber 100, thereby providing ion energy necessary for performing a deposition or other plasma enhanced process. The RF bias power sources 185, 186 are generally capable of producing an RF signal having a frequency of from about 50 kHz to about 200 MHz and a power between about 0 watts and about 5000 watts.

One or more RF sources 147 provides a bias potential through a matching network to the showerhead assembly 140 to facilitate the generation of a plasma between the showerhead assembly 140 and the pedestal 112. Alternatively, the RF sources 147 and matching network 145 may be coupled to the showerhead assembly 140, pedestal 112, or both, or coupled to an antenna (not shown) disposed external to the processing chamber 100. In some embodiments, the RF sources 147 may provide between about 10 watts and about 3000 watts at a frequency of about 30 kHz to about 13.6 MHz. Alternatively, the RF source 147 may be a microwave generator that provide microwave power to the heated showerhead 144 that assists generation of the plasma in the interior volume 110.

The gas distribution plate 158 comprises a plurality of through holes 158b that fluidly couple the first plenum 160 to the second plenum 162 to allow for the process gas in the first plenum 160 to pass through the gas distribution plate 158 and into the second plenum 162. The ion filter 146 includes a plurality of through holes 146b to allow the activated species (e.g., radicals) generated in the plasma to flow from the second plenum 162 to the processing volume 178 of the processing chamber 100. The second plenum 162 provides a second cavity or space to allow for the ignition of the process gas to form the plasma and to further allow for the accumulation of the plasma to facilitate dispersion of the plasma species via the through holes 146b. In some embodiments, during plasma processing, the vacuum pump 124 provides a negative pressure in the processing volume 178 relative to a second plenum 162, thus allowing the species in the second plenum 162 to flow to the processing volume 178. Providing multiple regions for plasma to be formed (e.g., in the second plenum 162 and the processing volume 178) provides multiple excitation stages of the plasma to facilitate enhanced radical generation, as compared to plasma sources that may utilize a single cavity to form the plasma.

Prior to use in plasma processing, the showerhead assembly 140 may be seasoned to coat the surfaces of the showerhead assembly 140, for example, with TiN. The seasoning can also control metal from the showerhead assembly from contaminating the substrate during plasma processing. The gas conduits 130 may be connected to supplies of various gases such as $TiCl_4$, $N_2$, and $NH_3$. In at least some embodiments, the first plenum 160 may be purged with $N_2$ from the gas conduits 130, second plenum 162 may be purged with $N_2$ supplied through gap 174, and the processing volume 178 may be purged with a $N_2$ supplied through gap 176. Once purged, the $TiCl_4$ and $NH_3$ be introduced separately into the first plenum 160 and heated and mixed in the first plenum 160 while the heater is operating and the temperature of the ion filter 146 is at or above 575 degrees Celsius. By mixing and heating the $TiCl_4$ and $NH_3$ in the first plenum, low temperature mixing of the $TiCl_4$ and $NH_3$ can be minimized, thereby facilitating thermal TiN seasoning. Once the showerhead assembly 140 is thermally seasoned, the first plenum 160, second plenum 162, and processing volume 178 can be purged again as discussed above before reactant gas in introduced into the showerhead assembly 140 through gas conduits 130 for plasma processing.

Figure 4:
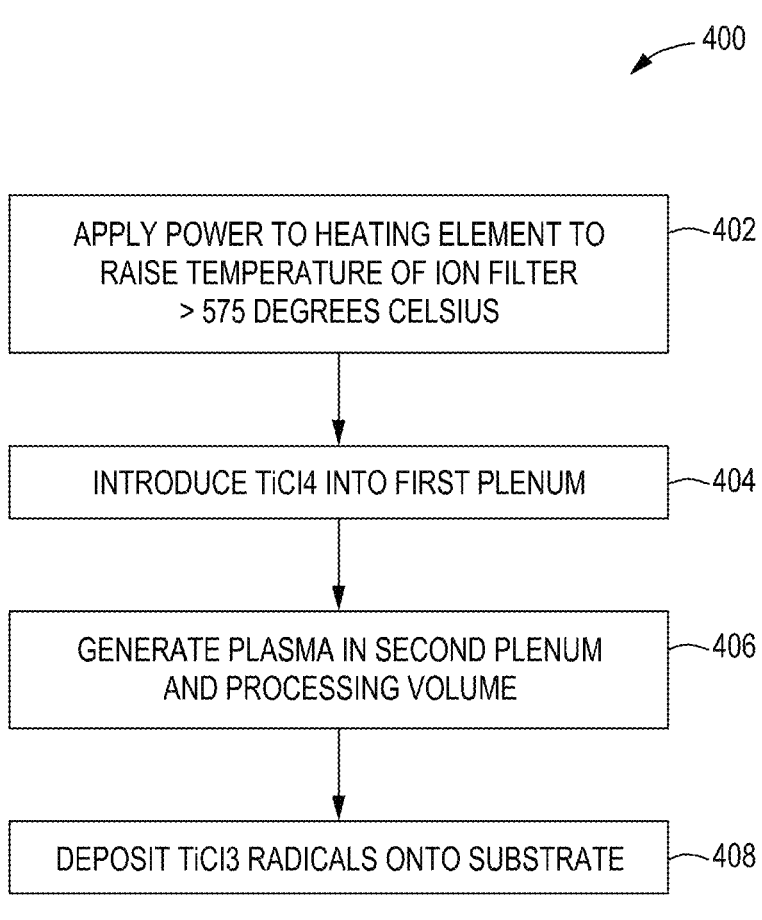
FIG. 4 is a flow chart of a method of a plasma processing method in accordance with at least some embodiments of the present disclosure.

FIG. 4 illustrates a plasma processing method 400 in accordance with the disclosure. The method may be performed after seasoning the showerhead assembly 140. The exemplary method described herein is described in the context of $TiCl_3$ deposition from $TiCl_4$. However, the method is not limited to such materials. At block 402, the heater element 150 is turned on to raise the temperature of the ion filter 146 to a temperature at which species in the desired gas plasma do not condense (e.g., at least 575 degrees Celsius). At block 404 process gases (e.g., $H_2$, $TiCl_4$) are separately introduced into the first plenum 160 through the gas panel 172 and the gas conduits 130. The process gases mix and are heated in the first plenum 160 and flow through the through holes 158b of the gas distribution plate 158 into the second plenum 162. At block 406 plasma is generated in the second plenum 162 and the processing volume 178. At block 408 species (e.g., $TiCl_3$) in the second plenum 162 pass through the through holes 146b of the ion filter 146, thus allowing the species to flow to the processing volume 178 and deposit on the surface of the substrate 116. The temperature of the ion filter 146 can be maintained above the temperature at which species in the plasma condense, leading to improved higher species density and uniformity along the substrate 116. By providing a purge or cleaning gas flow to regions of the showerhead assembly as described above, deposition of materials in those regions can be reduced or eliminated, which can, for example, advantageously reduce or eliminate arcing during deposition of metals.

Figure 5:
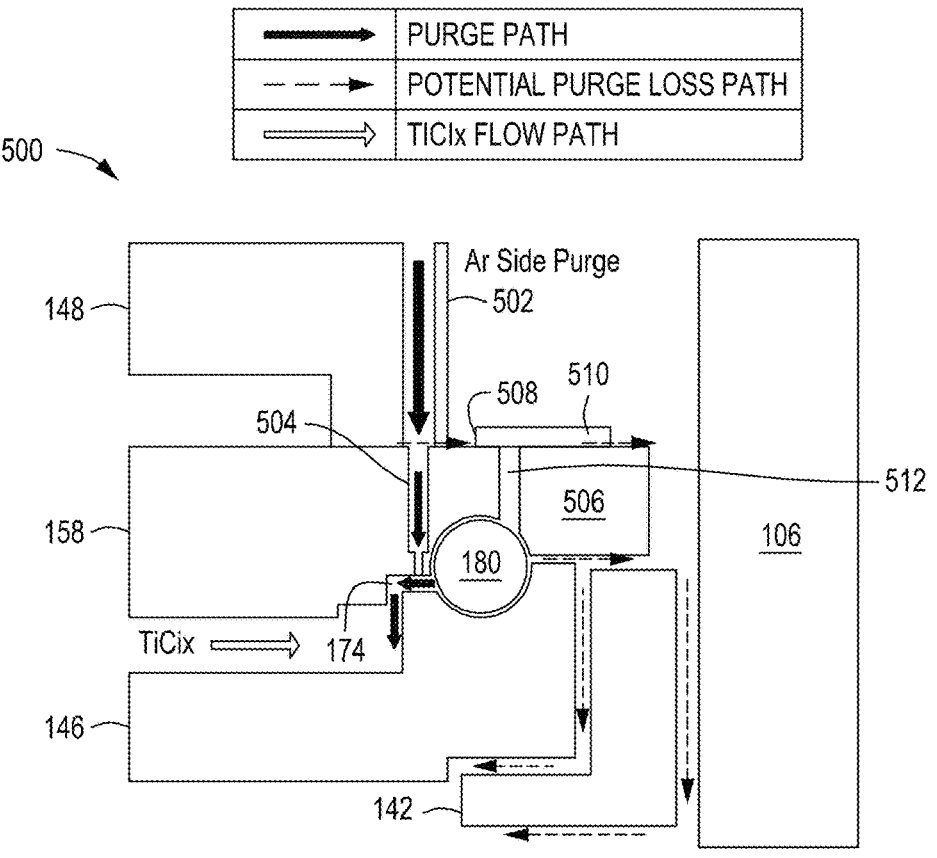
FIG. 5 is a schematic side view of a portion of a showerhead assembly in accordance with at least some embodiments of the present disclosure.
Figure 6:
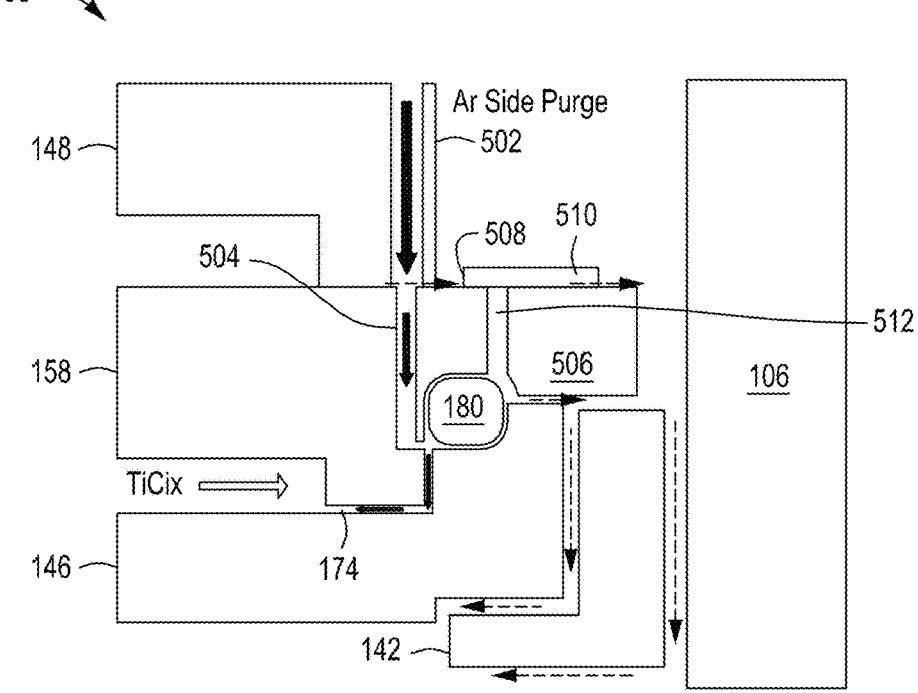
FIG. 6 is a schematic side view of a portion of a showerhead assembly in accordance with at least some embodiments of the present disclosure.

FIG. 5 is a schematic side view of a portion of a showerhead assembly 500 in accordance with at least some embodiments of the present disclosure. FIG. 6 is a schematic side view of a portion of a showerhead assembly 600 in accordance with at least some embodiments of the present disclosure. As shown in FIGS. 5 and 6, a gas (e.g., a purge gas such as argon or a cleaning gas such as chlorine) can be provided, for example, through a first passage 502 in a heater plate 148 and continuing through a second passage 504 in a gas distribution plate 158 to the region or space (e.g., gap 174) between the showerhead and an ion filter 146 adjacent a spacer ring 180. As shown in FIG. 5, the gap 174 is on a radially inner side of the spacer ring 180. A upper isolator 506 may be disposed atop a lower isolator 142 and about the gas distribution plate 158 and the spacer ring 180. The upper isolator 506 may be made of the same material as the lower isolator 142. A sealing ring 508 may be disposed atop the gas distribution plate 158 and the upper isolator 506 to provide a better seal between the outer periphery of the gas distribution plate 158 and the ion filter 146.

The sealing ring 508 can be fabricated of a process-compatible suitable material to withstand high temperatures and processing environment, such as nickel or ceramic-coated titanium (e.g., aluminum oxide coating). In some embodiments, the sealing ring 508 can be about 20-50 thousandths thick, although other thicknesses may be used in other applications. The sealing ring 508 can be fastened (e.g., screwed or bolted) to the gas distribution plate 158 and extends radially outward from the gas distribution plate 158. In some embodiments, a plurality of screws (not shown), such as about 12-16 screws, can be provided, for example approximately azimuthally evenly spaced, to fasten the sealing ring 508 to the gas distribution plate 158. For example, in typical PECVD deposition of titanium using the gas distribution plate 158 assembly as described herein, the inventors have observed concentrations as low as 1 part per million of TiCl proximate the gap 174 and sealing ring 508.

A cantilevered portion 510 of the sealing ring 508 provides a spring bias force against the upper isolator 506 pushing the upper isolator 506 downward against the ion filter 146 to improve the seal between the gas distribution plate 158 and the sealing ring 508, the sealing ring 508 and the upper isolator 506, and the upper isolator 506 and the ion filter 146. The cantilevered portion 510 of the sealing ring 508 is long enough to ensure contact with the upper isolator 506 and provide a good downward biasing force. Thus, the sealing ring 508 and upper isolator 506 effectively seal a volume 512 between the gas distribution plate 158, the ion filter 146, the upper isolator 506, and the spacer ring 180. The volume 512 is essentially a dead volume to contain gas, such as purge gas, and to prevent migration of TiCl into the volume 512. Arrows with broken lines in FIGS. 5 and 6 also show a potential purge loss path for purge gas that manages to escape the volume 512. Such purge gas may flow between the sealing ring 508 and the upper isolator 506 and between the upper isolator 506 and the ion filter 146. Also, such purge gas may flow between the lower isolator 142 and the ion filter 146 and between the lower isolator 142 and the side wall 106.

As shown in FIG. 5, in some embodiments, the spacer ring 180 can have a circular cross-section. As shown in FIG. 6, in some embodiments, the spacer ring 180 can have an oblong cross-section, such as rectangular with rounded corners. Other shapes can be used as well to control the surface area contact between the spacer ring 180 with either or both of the gas distribution plate 158 and the ion filter 146.

Figure 7:
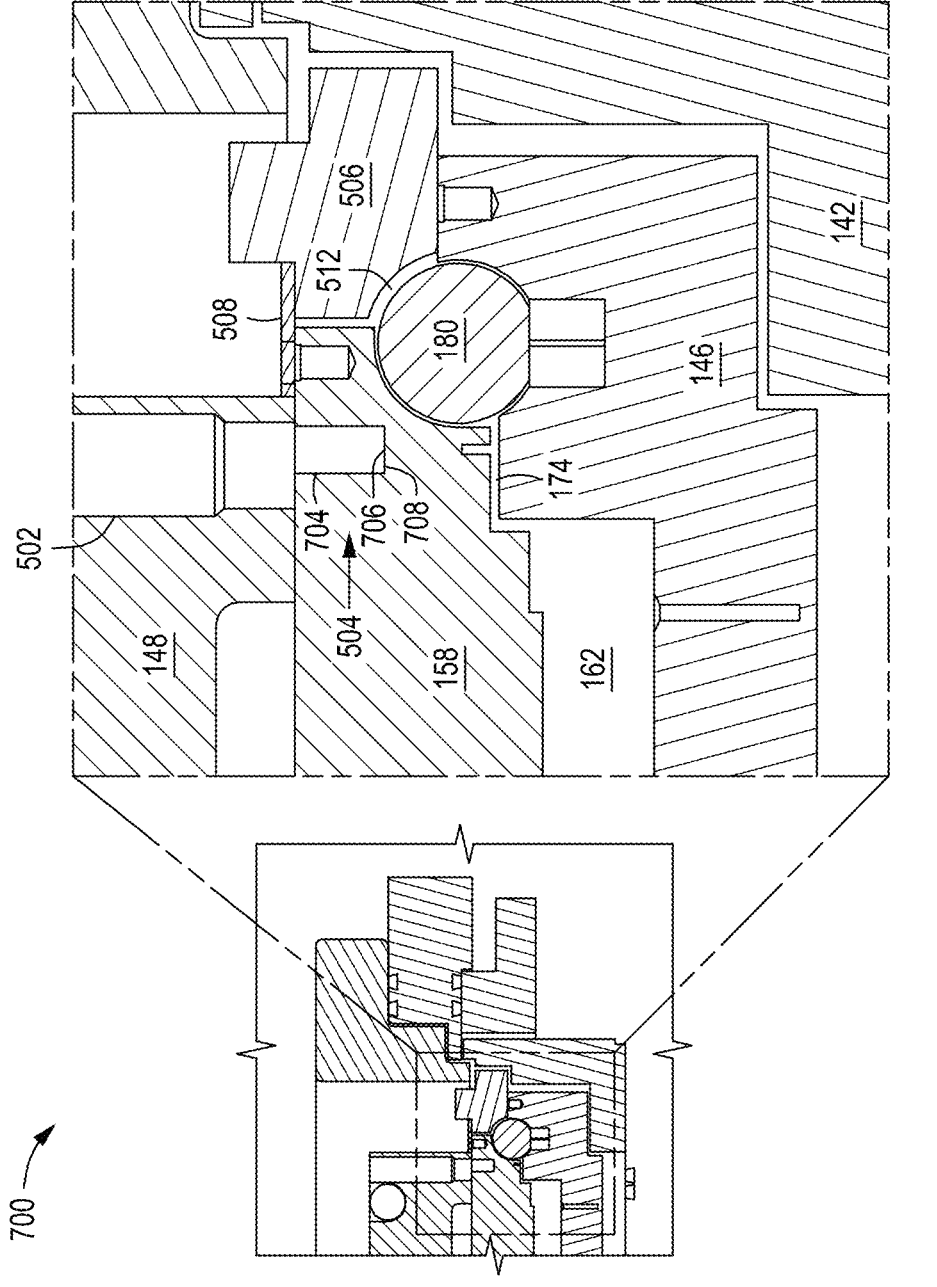
FIG. 7 is a schematic side view of a portion of a showerhead assembly in accordance with at least some embodiments of the present disclosure.
Figure 8:
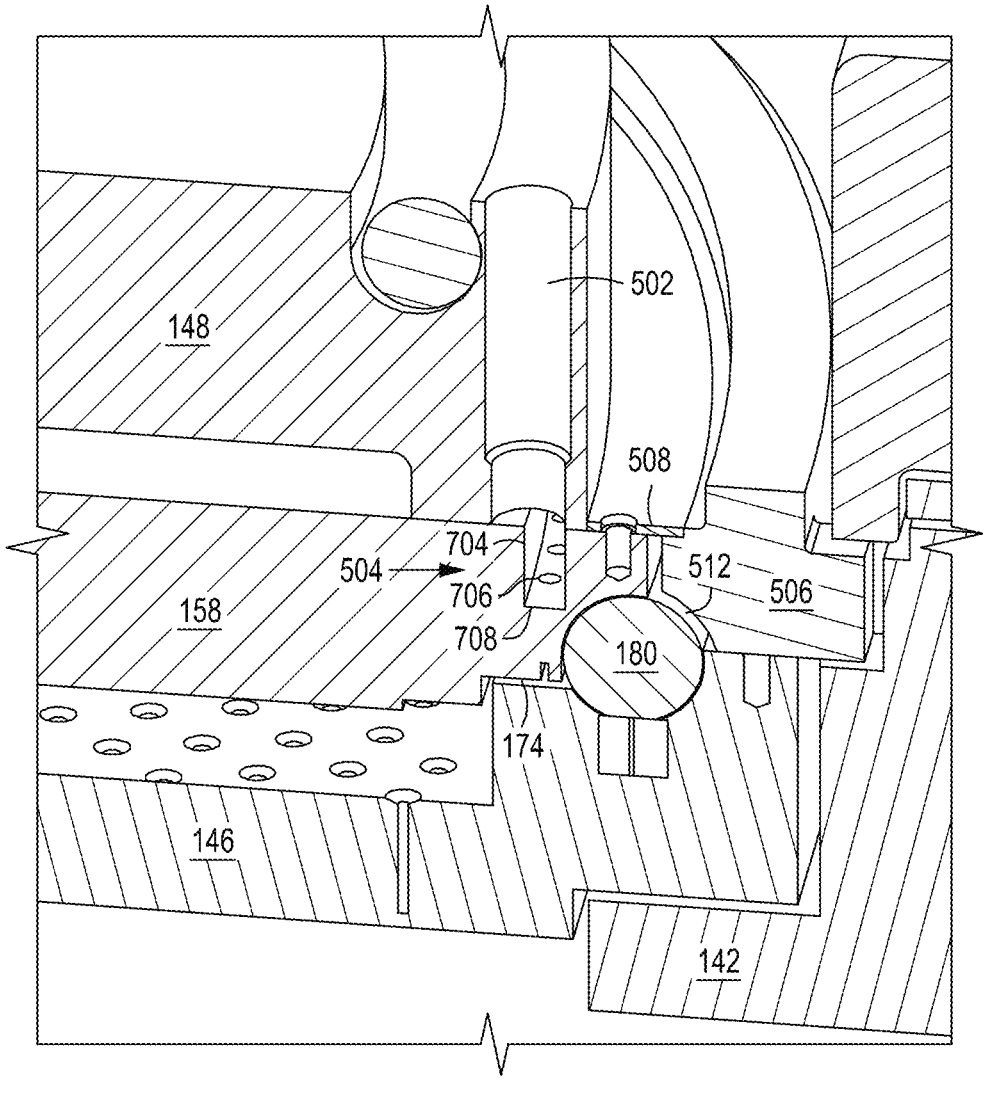
FIG. 8 is an isometric cross-sectional view of a portion of the showerhead assembly of FIG. 7.

FIG. 7 is a schematic side view of a portion of a showerhead assembly 700 in accordance with at least some embodiments of the present disclosure. FIG. 8 is an isometric cross-sectional view of a portion of the showerhead assembly 700 of FIG. 7. FIGS. 7 and 8 depict an embodiment of the showerhead assembly 700 similar to that described above with respect to FIGS. 5 and 6, but in solid model view showing more details. As can be best seen in FIG. 8, a first passage 502 extends through the heater plate 148 (shown near the outer periphery and in cross section). The first passage 502 is aligned with an annular channel 704 formed in the upper surface of the gas distribution plate 158. A plurality of through holes 706 are formed in the gas distribution plate 158 between a bottom surface 708 of the annular channel 704 and a bottom 710 of the gas distribution plate 158, positioned proximate the spacer ring 180 and facing the ion filter 146 (e.g., along the gap 174, shown in FIG. 1). Similar to the showerhead assemblies 500 and 600 shown in FIGS. 5 and 6, respectively, the seal ring 508 in FIGS. 7 and 8 is fastened, such as with screws or bolts (not shown), to the gas distribution plate 158 and the seal ring 508 pushes down on and seals against the upper isolator 506.

Gas, such as a purge gas or a cleaning gas, can be provided through the first passage 502 to flow into the annular channel 704. The gas fills the annular channel 704 and flows through the plurality of through holes 706 into the gap 174 proximate the spacer ring 180 and between the gas distribution plate 158 and the ion filter 146. The gas then flows predominantly radially inward along the gap 174 to the remote cavity (e.g., the second plenum) 162 formed between the gas distribution plate 158 and the ion filter 146. Any gas that flows toward the spacer ring 180 or around the spacer ring 180 (e.g., between the spacer ring 180 and the gas distribution plate 158, between the spacer ring 180 and the ion filter 146, and/or through gaps, such as gaps 184 described above) and into the volume 512 (which essentially forms a dead volume filled with the gas) effectively prevents TiCl from reaching the volume 512 and depositing on component surfaces defining the volume 512, such as surfaces of the gas distribution plate 158, ion filter 146, spacer ring 180, and upper isolator 506.

Figure 9:
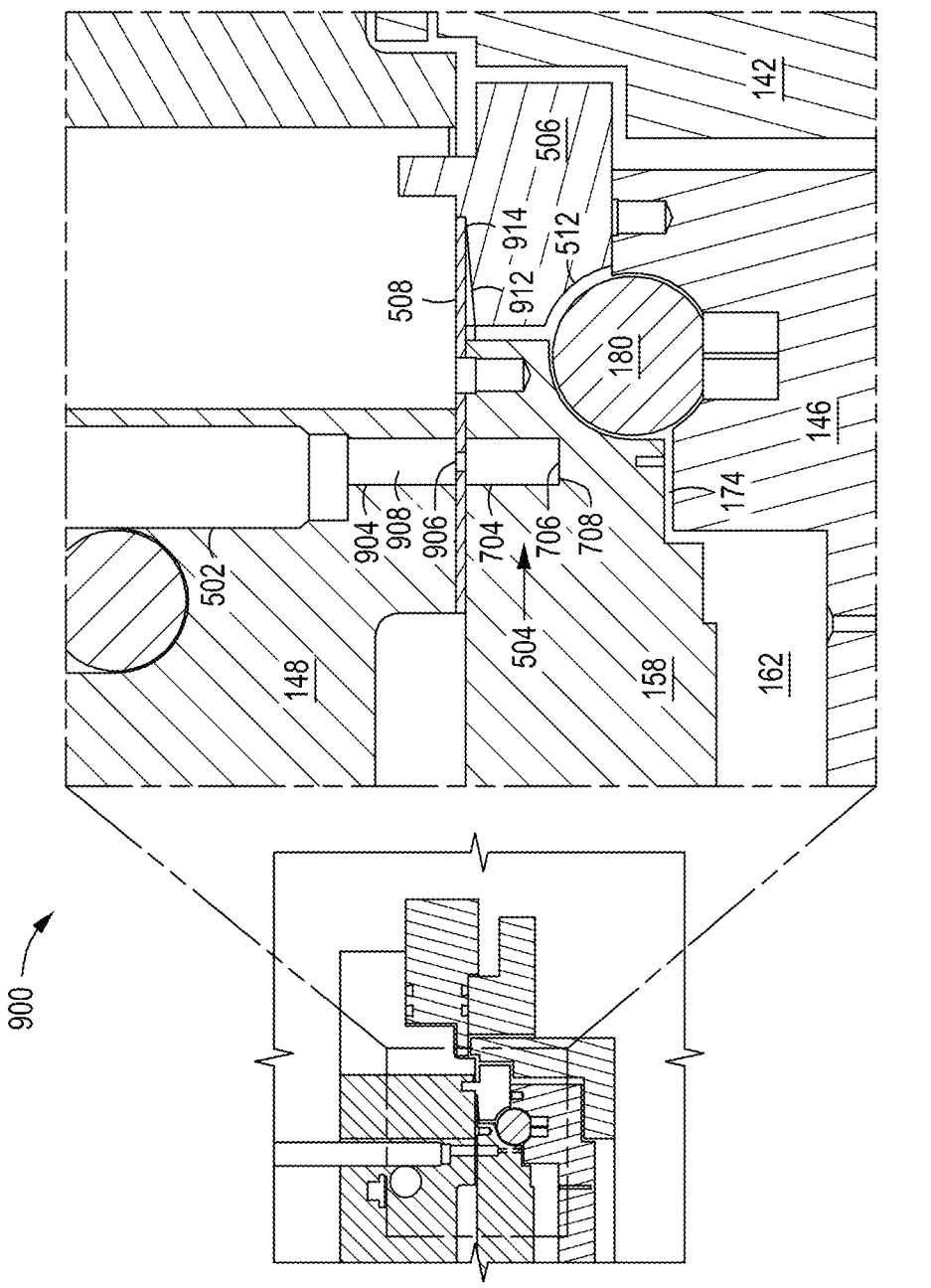
FIG. 9 is a schematic side view of a portion of a showerhead assembly in accordance with at least some embodiments of the present disclosure.
Figure 10:
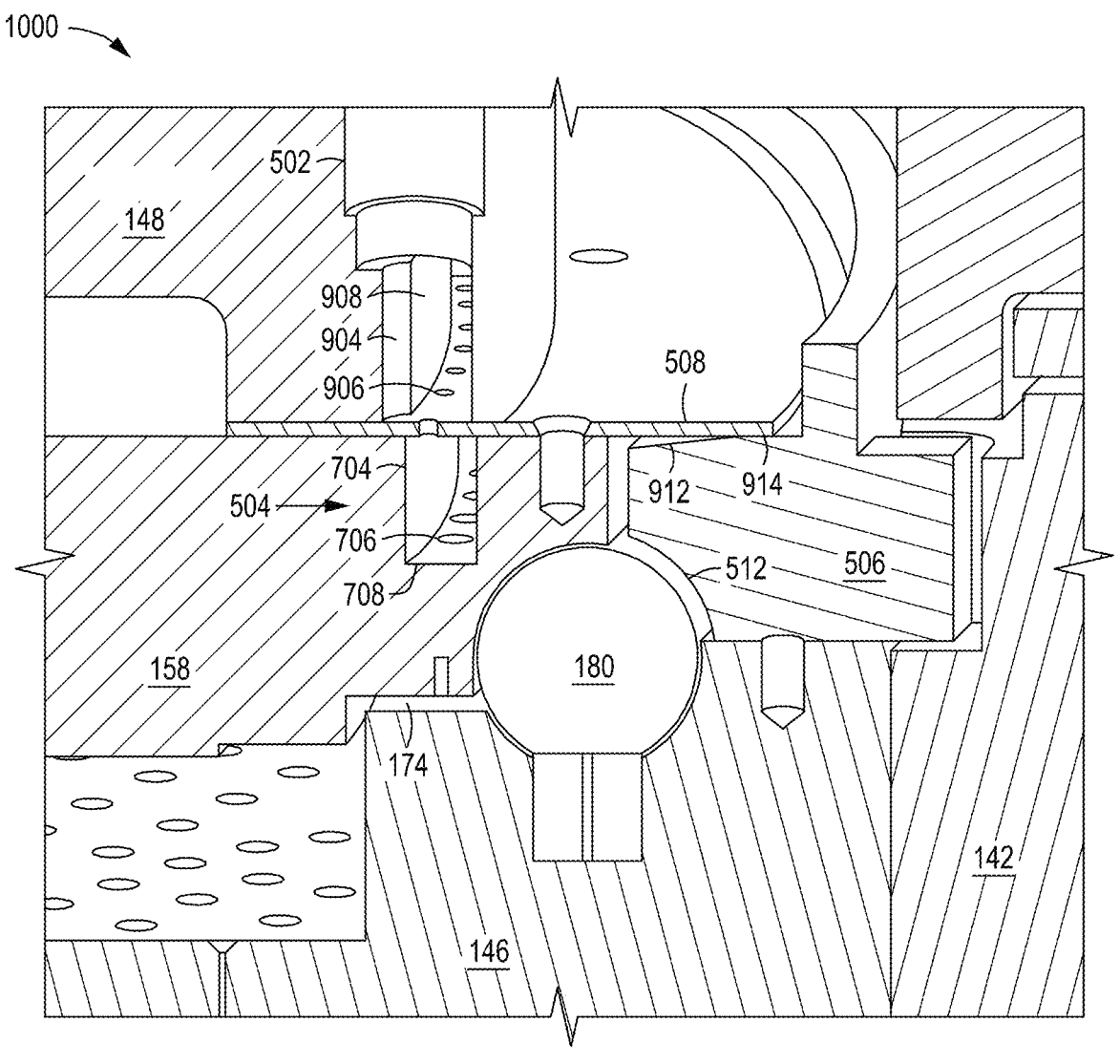
FIG. 10 is an isometric cross-sectional view of a portion of the showerhead assembly of FIG. 9.

FIG. 9 is a schematic side view of a portion of a showerhead assembly 900 in accordance with at least some embodiments of the present disclosure. FIG. 10 is an isometric cross-sectional view of a portion of the showerhead assembly of FIG. 9. FIGS. 9 and 10 depict an embodiment of the showerhead assembly 900 similar to that described above with respect to FIGS. 7 and 8, but with some differences. As best shown in FIG. 10, the sealing ring 508 can extend between the heater plate 148 and the ion filter 146 and the bottom surface of the heater plate 148 can include an annular channel 904 wherein the first passage 502 terminates in the annular channel 904 of the heater plate 148. The annular channel 904 of the heater plate 148 is aligned with the annular channel 704 of the gas distribution plate 158. A plurality of through holes 906 can be provided in the sealing ring 508 between the annular channel 904 of the heater plate 148 and the annular channel 704 of the gas distribution plate 158. The annular channel 904 of the heater plate 148 forms a first plenum 908 for gas to distribute about the heater plate 148 prior to flowing through the sealing ring 508 to the annular channel 704 of the gas distribution plate 158, which forms a second plenum 910 where gas further distributes before flowing through the plurality of through holes 706 in the gas distribution plate 158 and to the gap 174. Providing multiple plenums (e.g., first plenum 908 and second plenum 910) facilitates more even distribution of the gas provided to the gap 174.

As also shown in FIGS. 9 and 10, but which can be provided in embodiments without multiple plenums such as described above, the upper isolator 506 can include an angled upper surface 912 that slopes downwardly and inwardly. and defines a contact point 914 on the angled upper surface for contact with the sealing ring 508. The contact point 914 is positioned close to the radially outer edge of the sealing ring 508, thus maximizing the bias force against the upper isolator 506 and improving sealing of the volume 512.

Figure 11:
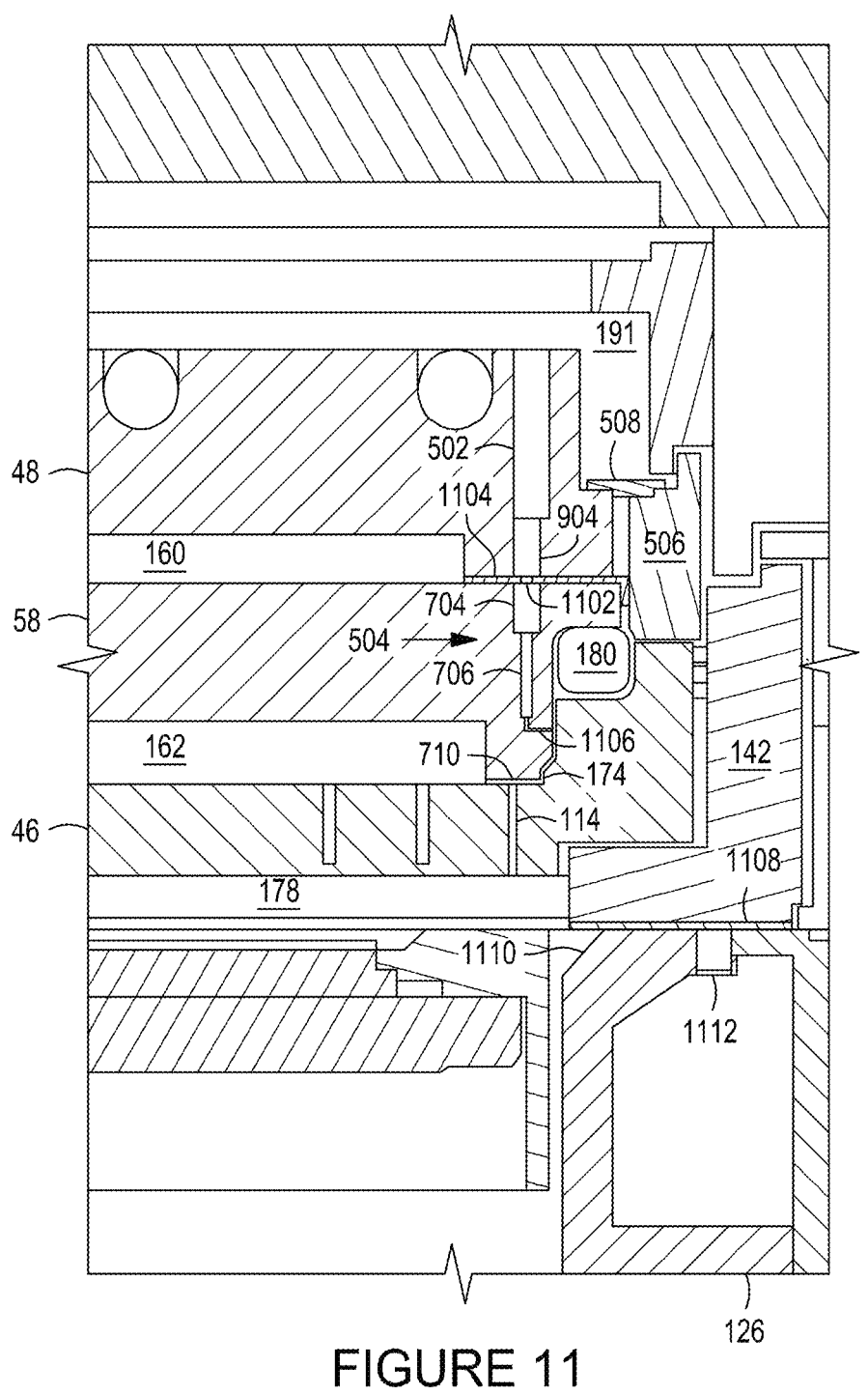
FIG. 11 is a schematic side view of a portion of a showerhead assembly in accordance with at least some embodiments of the present disclosure.

FIG. 11 is a schematic side view of a portion of a showerhead assembly 1100 in accordance with at least some embodiments of the present disclosure. FIG. 11 depicts an embodiment of the showerhead assembly 1100 similar to that described above with respect to FIGS. 9 and 10, but with some differences. As best shown in FIG. 11 the sealing ring 508 is fastened to the heater plate 148 and extends to seal against the upper isolator 506 defining the volume 512 between the sealing ring 508, spacer ring 180, gas distribution plate 158, heater plate 148, upper isolator 506, and ion filter 146. The sealing ring 508 provides reduced leakage from the volume 512 into purge volume 191.

The heater plate 148 may also include first passage 502 having annular channel 904 along a bottom of the heater plate 148. The annular channel 904 of the heater plate 148 is aligned with the annular channel 704 of the gas distribution plate 158. Below the sealing ring 508, a sealing ring 1104 extends between the bottom of the heater plate 148 and the top of the gas distribution plate 158. The sealing ring 1104 includes a plurality of holes 1102 to permit gas flow between the annular channel 904 and the annular channel 704. The sealing ring 1104 may be a metal seal that seals annular channels 907 and 704 from the first plenum 160. The sealing ring 1104 and the sealing ring 508 may be made from the same materials.

A plurality of through holes 706 are formed in the gas distribution plate 158 between a bottom surface 708 of the annular channel 704 and a location above a bottom 710 of the gas distribution plate 158. A plurality of radially directed holes 1106 are formed in the gas distribution plate 158 extending radially outwardly from the second passage 504 to connect through holes 706 with the gap 174. In some embodiments, and as shown in FIG. 11, the holes 1106 may be located below the spacer ring 180 and above the bottom 710 of the gas distribution plate 158.

The ion filter 146 includes a plurality of through holes 1114 near a periphery of the ion filter 146. The through holes 1114 allow gas (e.g., purge gas) in the gap 174 to flow into the processing volume 178 and the pumping ring 126, which may the reduce concentration of precursor in the center of the remote cavity (e.g., second plenum) 162.

As also shown in FIG. 11, but which can be provided in other embodiments, a metal sealing ring 1108 may extend between a bottom of the lower isolator 142 and a top of the pumping ring 126 to close openings 1112 in the pumping ring 126 and to block gas flow between the bottom of the lower isolator 142 and the top of the pumping ring 126 to prevent TiCl$_4$ back diffusion and shorting of the direct plasma. Closing the openings 1112 directs gas (e.g., purge gas) entering the processing volume 178 (through holes 1114 or between ion filter 146 and lower isolator 142) into openings 1110 in the pumping ring 126.

Thus, as a result of the configurations of the showerhead assemblies and process chambers in accordance with the present disclosure, metal vapor can be kept from reaching the surfaces defining the volume 512 by a strong purge (e.g., argon purge), thereby reducing metal coating of such surfaces which could cause unwanted shorting.

Figure 12:
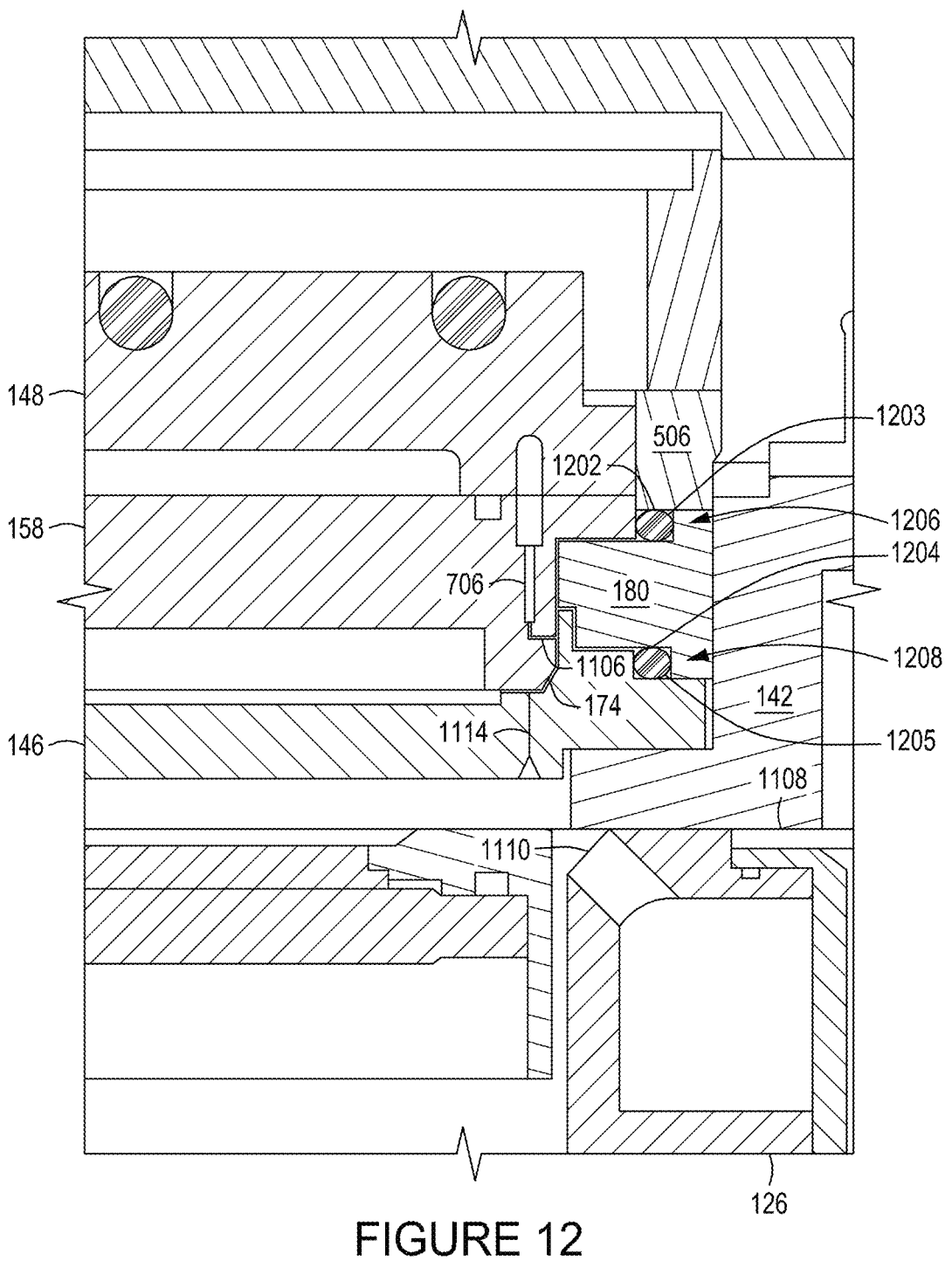
FIG. 12 is a schematic side view of a portion of a showerhead assembly in accordance with at least some embodiments of the present disclosure.

FIG. 12 is a schematic side view of a portion of a showerhead assembly 1200 in accordance with at least some embodiments of the present disclosure. FIG. 12 depicts an embodiment of the showerhead assembly 1200 similar to the showerhead assembly 1100 described above with respect to FIG. 11, but with some differences. The showerhead assembly 1200 omits the sealing ring 508 and the sealing ring 1104. In some embodiments, and as shown in FIG. 12, the showerhead assembly 1200 includes the spacer ring 180 having a generally T-shaped profile, an upper sealing ring 1202, and a lower sealing ring 1204. The spacer ring 180 may have an upper shoulder 1206 that extends to seal against the upper isolator 506. The spacer ring 180 may have a lower shoulder 1208 that extends to seal against the ion filter 146. The upper sealing ring 1202 may be located in a space 1203 defined by the upper shoulder 1206, the upper isolator 506, and the gas distribution plate 158. The lower sealing ring 1204 is located in a space 1205 defined by the lower shoulder 1208 and the ion filter 146. The space 1203 is sealed by the upper sealing ring 1202 and the space 1205 is sealed by the lower sealing ring 1204.

In some embodiments, the upper sealing ring 1202 and the lower sealing ring 1204 may be formed as compliant metal sealing rings, which may be made of a thermally conductive material that is also chemically process compatible, such as nickel. In some embodiments, and as shown in FIG. 12, the upper sealing ring 1202 and the lower sealing ring 1204 are single pieces and may have a channel profile (e.g., C-channel).

In some embodiments, and as shown in FIG. 12, the spacer ring 180 is formed as a single piece and may be formed of the same materials (e.g., aluminum nitride) as described above for the spacer ring 180. In some embodiments, the spacer ring 180 is an insulator of high conductivity material, such as aluminum nitride, that provides insulation of gas distribution plate 158 and the ion filter 146.

The upper sealing ring 1202 and the lower sealing ring 1204 are configured to allow for thermal expansion (e.g., radially) of the gas distribution plate 158 and the ion filter 146. When operating at elevated processing temperature during substrate processing, the thermal expansion of the gas distribution plate 158 will cause the gas distribution plate 158 to compress the upper sealing ring 1202 against the upper shoulder 1206 of the spacer ring 180 forming a seal. Also, when operating at elevated processing temperature, the thermal expansion of the ion filter 146 will cause the ion filter 146 to compress the lower sealing ring 1204 against the lower shoulder 1208 of the spacer ring 180 forming a seal. In some embodiments, the upper sealing ring 1202 and the lower sealing ring 1204 may be permanently deformed upon being compressed and, thus, may be replaced after substrate processing is complete.

In some embodiments, at elevated processing temperature the gas distribution plate 158 and ion filter 146, which may be made of nickel, expand much more than the spacer ring 180, which may be made of aluminum nitride. As a result of the differences in expansion, the spaces 1203 and 1205 may be significantly reduced, thus causing the upper sealing ring 1202 and the lower sealing ring 1204 to be compressed. The compression of the upper sealing ring 1202 and the lower sealing ring 1204 results in sealing off space 1203 and space 1205, thus creating a very effective annular purge volume formed by purge gas (e.g., inert gas, such as argon) flowing from holes 1106. In addition, in embodiments where the upper sealing ring 1202 and the lower sealing ring 1204 are formed of metal, the metal seals being made of a highly conductive metal also may transmit significant heat from the gas distribution plate 158 to the ion filter 146, thus keeping the ion filter 146 well above the temperature for condensation of $TiCl_3$ radicals that may be used for substrate processing.

When the upper sealing ring 1202 and the lower sealing ring 1204 are compressed, the gap 174 between the gas distribution plate 158 and the spacer ring 180, between gas distribution plate 158 and the ion filter 146, and between the ion filter 146 and the spacer ring 180 may be about 0.8 mm. When operating at elevated processing temperature during substrate processing, a purge gas (e.g., argon) may flow through holes 706 and holes 1106, so that a portion of the purge gas will flow into the gap 174 and towards both the upper sealing ring 1202 and the lower sealing ring 1204, thereby preventing back diffusion of process gases into the gap 174 and preventing metal vapor from reaching the surfaces of the gas distribution plate 158, the ion filter 146, and the spacer ring 180 extending along the gap 174, thereby reducing metal coating of such surfaces which could cause unwanted shorting.

While the foregoing is directed to embodiments of the present disclosure, other and further embodiments of the disclosure may be devised without departing from the basic scope thereof.

The invention claimed is:

1. A showerhead assembly for use in a process chamber, comprising:
   a heated showerhead having a heater plate and a gas distribution plate coupled to the heater plate;
   an ion filter spaced from the heated showerhead;
   a spacer ring between the heated showerhead and the ion filter;
   a remote plasma region defined between the heated showerhead and the ion filter;
   a gap, on a radially inner side of the spacer ring, between the gas distribution plate and the ion filter, the gap being in fluid communication with the remote plasma region;
   a first passage extending through the heater plate;
   a second passage in communication with the first passage and extending through the gas distribution plate, the second passage extending to the gap;
   an upper isolator spaced from the spacer ring and supported on a portion of the ion filter radially outward of the spacer ring;
   a sealing ring fastened to the heated showerhead sealing against the upper isolator and pushing the upper isolator against the ion filter; and
   a volume defined by the heated showerhead, the ion filter, the sealing ring, the upper isolator, and the spacer ring, wherein the volume is in fluid communication with the gap.

2. The showerhead assembly of claim 1, wherein the spacer ring includes a plurality of elements that are circumferentially spaced from one another by a gap of 0.5 mm to 0.7 mm.

3. The showerhead assembly of claim 1, wherein the spacer ring is formed as a single piece and the gap is 0.5 to 0.7 mm.

4. The showerhead assembly of claim 3, wherein the spacer ring has an upper shoulder and a lower shoulder, and the showerhead assembly further comprises an upper sealing ring located in a space defined at least in part by the upper shoulder and the gas distribution plate; and a lower sealing ring located in a space defined at least in part by the lower shoulder and the ion filter.

5. The showerhead assembly of claim 1, wherein the second passage includes an annular channel aligned with the first passage and formed in an upper surface of the gas distribution plate, and a plurality of through holes formed in the gas distribution plate between a bottom surface of the annular channel and a bottom or side of the gas distribution plate proximate the gap.

6. The showerhead assembly of claim 5, wherein first passage includes an annular channel formed in a bottom surface of the heater plate and aligned with the annular channel formed in the upper surface of the gas distribution plate.

7. The showerhead assembly of claim 6,
   wherein the sealing ring extends between the heater plate and the gas distribution plate and includes a portion with through holes extending between the first passage and the second passage.

8. The showerhead assembly of claim 1, wherein the ion filter includes a plurality of through holes below the second passage along a periphery of the ion filter.

9. The showerhead assembly of claim 1, wherein the upper isolator includes an angled upper surface that slopes downwardly and radially inwardly and defines a contact point on the angled upper surface for contact with the sealing ring.

10. A showerhead assembly for use in a process chamber, comprising:
   a heated showerhead having a heater plate and a gas distribution plate coupled to the heater plate;
   an ion filter spaced from the heated showerhead;
   a spacer ring between the heated showerhead and the ion filter, the spacer ring being thermally conductive and electrically insulative;
   a remote plasma region defined between the heated showerhead and the ion filter;
   a gap, on a radially inner side of the spacer ring, between the heated showerhead and the ion filter, the gap being in fluid communication with the remote plasma region;
   a first passage extending through the heater plate; and
   a second passage in communication with the first passage and extending through the gas distribution plate, the second passage extending to the gap,
   wherein the gas distribution plate includes a plurality of holes extending radially outwardly from the second passage, and wherein the ion filter includes another plurality of through holes below the second passage along a periphery of the ion filter.

11. The showerhead assembly of claim 10, wherein the second passage includes an annular channel aligned with the first passage and formed in an upper surface of the gas distribution plate, and a plurality of through holes formed in the gas distribution plate between a bottom surface of the annular channel and a bottom of the gas distribution plate proximate the gap.

12. The showerhead assembly of claim 11, wherein the first passage includes an annular channel formed in a bottom surface of the heater plate and aligned with the annular channel formed in the upper surface of the gas distribution plate.

13. The showerhead assembly of claim 12, wherein the spacer ring is formed as a single piece.

14. The showerhead assembly of claim 10, wherein the spacer ring has a lower shoulder in contact with the ion filter and has an upper shoulder, and further comprising:

an upper isolator supported on the upper shoulder of the spacer ring;

an upper sealing ring in a space between the upper isolator, the upper shoulder, and gas distribution plate; and a lower sealing ring in a space between the lower shoulder and the ion filter.

15. A process chamber, comprising:

a chamber body having an interior volume;

a substrate support disposed in the interior volume;

a showerhead assembly disposed in the interior volume opposite the substrate support, wherein the showerhead assembly comprises:

a heated showerhead having a heater plate and a gas distribution plate coupled to the heater plate;

an ion filter spaced from the heated showerhead;

a spacer ring between the heated showerhead and the ion filter;

a remote plasma region defined between the heated showerhead and the ion filter;

a first gap, on a radially inner side of the spacer ring, between the gas distribution plate and the ion filter, the first gap being in fluid communication with the remote plasma region;

a first passage extending through the heater plate;

a second passage in communication with the first passage and extending through the gas distribution plate, the second passage extending to the first gap;

a lower isolator supporting the ion filter spaced above the substrate support; and a pumping ring supporting the lower isolator, wherein the lower isolator is at least partly disposed between the ion filter and the pumping ring, wherein a second gap is defined between the lower isolator and the ion filter, and wherein the pumping ring has a fluid passageway in fluid communication with the second gap.

16. The process chamber of claim 15, wherein the ion filter includes a plurality of through holes along a periphery of the ion filter, wherein the plurality of through holes in the ion filter are configured to direct a purge gas around the substrate support toward the fluid passageway of the pumping ring.

17. The process chamber of claim 15, wherein the chamber body includes a lid coupled to the showerhead assembly, further comprising a gas conduit extending between the lid and the heated showerhead, wherein the gas conduit supplies a purge gas to the first passage and the second passage.

* * * * *